(12) United States Patent
Wang

(10) Patent No.: US 6,707,129 B2
(45) Date of Patent: Mar. 16, 2004

(54) FUSE STRUCTURE INTEGRATED WIRE BONDING ON THE LOW K INTERCONNECT AND METHOD FOR MAKING THE SAME

(75) Inventor: Kun-Chih Wang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 10 days.

(21) Appl. No.: 10/020,311

(22) Filed: Dec. 18, 2001

(65) Prior Publication Data

US 2003/0111740 A1 Jun. 19, 2003

(51) Int. Cl.[7] .......................... H01L 29/00; H01L 21/82
(52) U.S. Cl. ........................ 257/529; 438/132
(58) Field of Search .................. 257/209, 529; 438/132, 215, 281, 333, 467, 601

(56) References Cited

U.S. PATENT DOCUMENTS

| | | | |
|---|---|---|---|
| 5,025,300 A | * | 6/1991 | Billig et al. |
| 5,936,296 A | * | 8/1999 | Park et al. |
| 6,054,340 A | * | 4/2000 | Mitchell et al. |

* cited by examiner

*Primary Examiner*—Sheila V. Clark

(57) ABSTRACT

A structure for using fuse structure integrated wire bonding on the substrate, and relates to methods for making the same are disclosed, in which an Al-fuse has an extra-etching process pattern by fuse-open mask and has been thinned down from Al-fuse thickness. The Al fuse structure integrated Al wire-bonding pad has two kind of thickness under fuse-open and for the other area. This invention makes the fuse easy to blow without suffering any bondability from wire bonding for packaging.

14 Claims, 3 Drawing Sheets

FUSE STRUCTURE INTEGRATED WIRE BONDING ON THE LOW K INTERCONNECT AND METHOD FOR MAKING THE SAME

BACKGROUND OF THE INVENTION

1. Field of the Invention

The present invention generally relates to a semiconductor device, and more particularly to a fuse structure integrated wire bonding on the low k interconnect, and relates to methods for making the same.

2. Description of the Prior Art

It is the nature of semiconductor physics that as the feature sizes are scaled down, the performance of internal devices in integrated circuits improves in a compounded fashion. That is, the device speeds as well as the functional capability improves. The overall circuit speed, however, becomes more dependent upon the propagation speed of the signals along the interconnections that connect the various devices together. With the advent of very and ultra large scale integration (VLSI and ULSI) circuits, it has therefore become even more important that the metal conductors that form the interconnections between devices as well as between circuits in the semiconductor have low resistivities for high signal propagation. Copper is often preferred for its low resistivities, as well as for resistance to electromigration and stress voiding properties.

On the other hand, considerable attention has focused on the replacement of silicon dioxide with new materials, having a lower dielectric constant, since both capacitive delays and power consumption depend on the dielectric constant of the insulator. Accordingly, circuit performance enhancement has been sought by combining the copper conductors with low dielectric constant layer (with dielectric constant k less than approximately 4).

Since low-k material can not sustain laser fusing, fuse of low-k interconnect is built in Al-pad layer, which is used for wire-bonding pad. As to provide good bondability for wire bonding, the Al-pad layer thickness for this pad is usually as thick as 10000 angstroms, sometimes even thicker. This is too thick for laser to blow, which diminishes the process margin of laser fusing. At some certain degree, it causes fusing failure.

For the forgoing reasons, there is a necessity for a structure for using fuse structure integrated wire bonding on the low k interconnect, and relates to methods for making the same. This invention applies a fuse open pattern in the metal layer.

SUMMARY OF THE INVENTION

In accordance with the present invention is provided to a fuse structure integrated wire bonding on the low k interconnect and relates to methods for making the same that wire bonding and process margin are provided both good bondability by laser fusing.

One object of the present invention is to provide a fuse structure integrated wire bonding on the low k interconnect and relates to methods for making the same to provide both good bondability for wire bonding and process margin for laser fusing.

In order to achieve the above objects, the present invention provides a fuse structure integrated wire bonding on the low k interconnect, and relates to methods for making the same. First of all, a first metal layer formed on the first portion of the substrate. Then, a second metal layer formed on the second portion of the substrate, wherein the second metal layer has a concavity thereon. Finally, a passivation layer on the first metal layer, the second metal layer, and the substrate, wherein the passivation layer has a first opening over the first metal layer and has a second opening substantially over the concavity of the second metal layer. The method at least includes the following steps. First of all, a cap layer is formed on the low k interconnect substrate. The low k interconnect comprises copper. Then, the metal layer is formed on the cap layer. The metal layer comprises aluminum. Next, a portion of the metal layer is removed to form a concavity of the metal layer, wherein the second opening align the hollow. The formation of Al-fuse has an extra-etch process patterned by using fuse-open mask and has been thinned down from Al-fuse thickness. The metal layer is removed to define a pad pattern and a fuse pattern on the substrate, wherein the fuse pattern have a fuse-open pattern on the top of the fuse pattern. Next, a conformal passivation layer is formed on the cap layer, the pad pattern, and the fuse pattern. The conformal passivation layer comprises silicon nitride or silicon oxide. Finally, a portion of the conformal passivation layer is removed to form a first opening on the top of the pad pattern and a second opening on the top of the fuse pattern, wherein the second opening is substantially over the concavity.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

The semiconductor devices of the present invention are applicable to a broad range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged, cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

This invention declares a bi-level Al-fuse for the Cu/low-k interconnect, which provides both good bondability for wire bonding and process margin for laser fusing. The formation of Al-fuse has an extra-etch process patterned by using fuse-open mask and has been thinned down from typically 10000 angstroms, Al-pad thickness, to 5000 angstroms, normal Al-fuse thickness. The Al fuse structure integrated Al wire-bonding pad has two kind of thickness, 5000 angstroms under fuse-open and 10000 angstroms for the other area. This makes the fuse easy to blow without suffering any bondability from wire-bonding for packaging.

The embodiment of the present invention is depicted in the FIGS. 1–5, which show a cross-section of fuse structure integrated wire bonding on the low k interconnect in accordance with the present invention.

Figure 1:
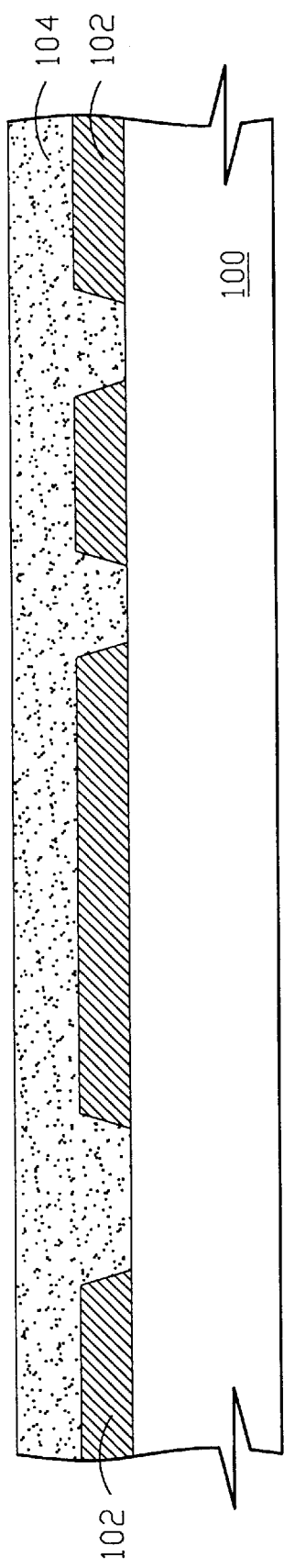
FIGS. 1–5 are cross-sectional schematic diagrams illustrating fuse structure integrated wire bonding on the low k interconnect in accordance with the present invention.

Referring to FIG. 1, a conductor having a low resistivity, such as copper, is provided in a low k interconnect substrate 100. Since copper has higher resistance to electromigration and lower electrical resistivity, it is a kind of preferred material for interconnect wiring. Then, a cap layer 102 is formed on the low k interconnect substrate 100, wherein the cap layer 102 has some openings (three in this embodiment) to expose the substrate 100. The cap layer 102 comprises oxide. The cap layer 102 can protect conductor from being harmed and provide a resistance of copper outward diffusion. Consequently, the cap layer 102 is acted as a passivation layer. Then, a metal layer 104 is formed on the cap layer 102. The metal layer 104 comprises aluminum. The metal layer 104 is formed with a thickness between 10000 angstroms and 20000 angstroms. In the embodiment, thickness of this layer 104 is preferable less than angstroms. The metal layer 104 is deposited by using a chemical vapor deposition (CVD), low pressure chemical vapor deposition (LPCVD), or plasma enhance chemical vapor deposition (PECVD) method. In the embodiment, deposit of this layer 104 is preferable method.

Figure 2:
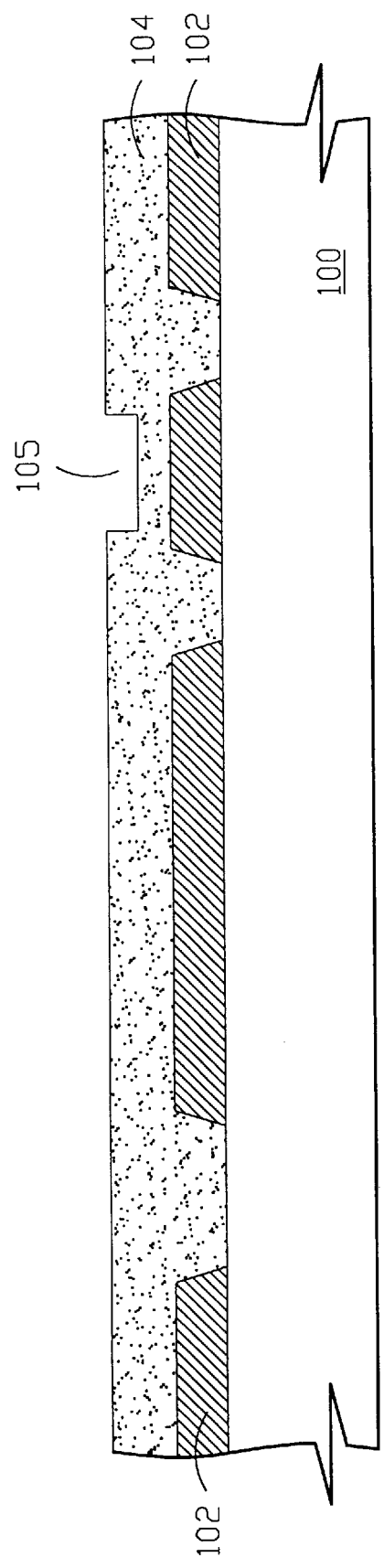

Referring to FIG. 2, a first photoresist layer is formed (not show in the figure) as a first mask over portions of the metal layer 104. The first photoresist layer may be spin-coated on the metal layer 104, and patterned to form a fuse-open through exposure and development. The mask isn't reworked because the mask of Al-fuse is formed after process. Once developed, the fuse-open will serve as a second mask to define the etching locations over the metal layer 104. However, a portion of the metal layer 104 is etched with fuse-open mask to form a concavity of the metal layer 104 to define a fuse-open pattern 105, wherein the formation of Al-fuse has an extra-etch process patterned by using fuse-open mask. The fuse-open pattern 105 is formed with a thickness of about 5000 angstroms in the metal layer 104. The stepwise profile of the metal layer 104 is different from the thickness of itself. The metal layer 104 is removed by using anisotropical etch. The anisotropical etch provides an opening in the second metal layer 104, and said opening keeping at a predetermined distance for the cap layer 102.

Figure 3:
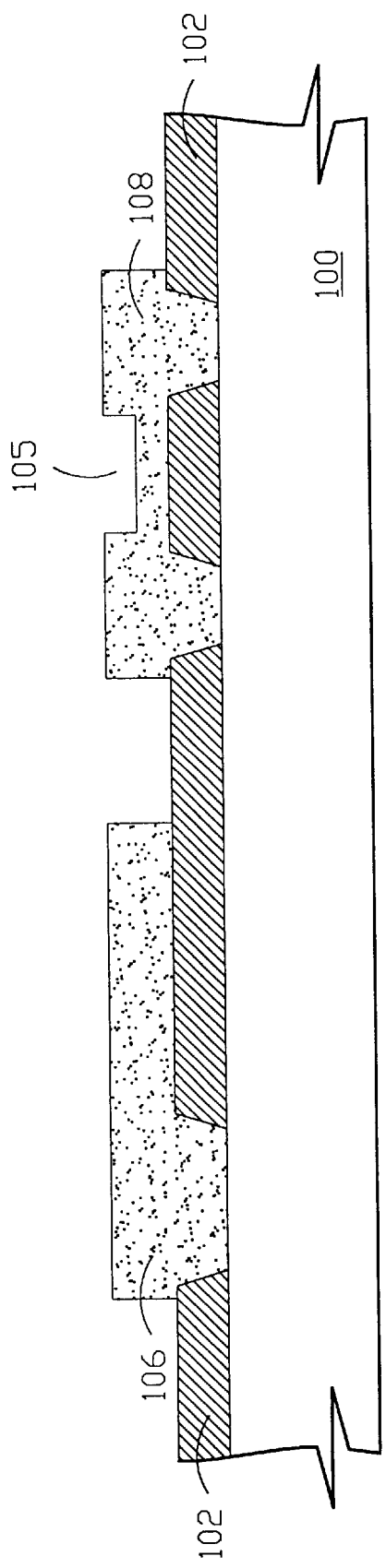

Referring to FIG. 3, a second photoresist layer (not show in the figure) is deposited on the metal layer 104. The second photoresist layer has a few openings (three in this embodiment) by using conventional lithographic technology, wherein the metal layer 104 is removed by using the second photoresist layer as a mask. The metal layer 104 is removed to define a pad pattern 106 and a fuse pattern 108 in the metal layer 104, wherein the fuse pattern 108 having the fuse-open pattern 105. The metal layer 104 is etched by using an anisotropical etch. The anisotropical etch provides an opening in the second metal layer 104, and said opening keeping at a predetermined distance for the cap layer 102.

Figure 4:
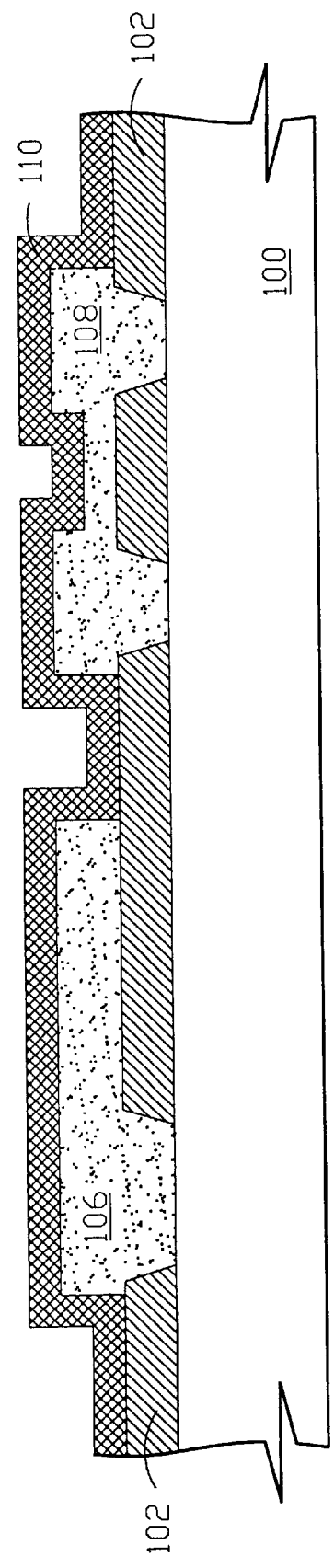

Referring to FIG. 4, a conformal passivation layer 110 is formed on the cap layer 102, the pad pattern 106, and the fuse pattern 108. The conformal passivation layer 110 comprises silicon nitride and/or silicon oxide. The conformal passivation layer 110 is formed with a thickness between 8000 angstroms and 15000 angstroms. In the embodiment, thickness of this layer is preferable less than angstroms. The conformal passivation layer 110 is deposited by using a chemical vapor deposition (CVD), low pressure chemical vapor deposition (LPCVD), or plasma enhance chemical vapor deposition (PECVD) method. In the embodiment, deposit of this layer 110 is preferable PECVD method. The conformal passivation layer 110 can protect pad pattern 106 and fuse pattern 108 from being harmed.

Figure 5:
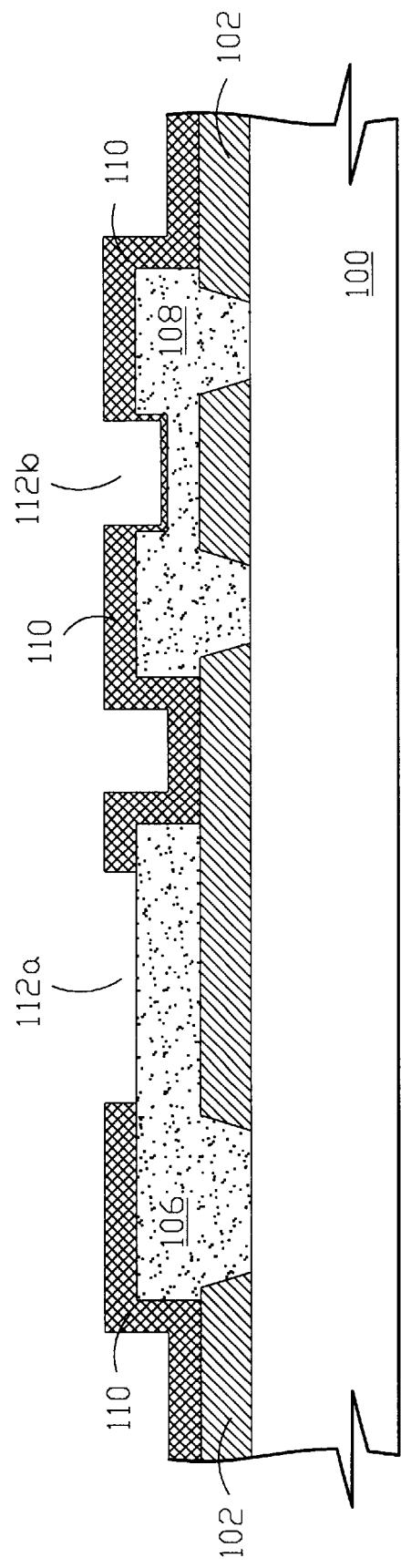

Referring to FIG. 5, a third photoresist layer (not show in the figure) is deposited on the conformal passivation layer 110. The third photoresist layer has an opening by using conventional lithographic technology. Then, a portion of the conformal passivation layer 110 is removed by using the fuse open as a mask. Then, a portion of the conformal passivation layer is removed to form an opening pattern 112a on the pad pattern 106 and an opening pattern 112b on the fuse pattern 108. The depth of the opening 102b in the fuse pattern 108 is deeper than the depth of the opening 102a in the pad pattern 106. The conformal passivation layer 110 is etched by using an anisotropical etch.

One of the objects of the present invention is to provide a better method and structure that the Al-fuse has an extra-etch process pattern by fuse-open mask and has been thinned down from typically 10000 angstroms, Al-pad thickness, to 5000 angstroms, normal Al-fuse thickness. The Al fuse structure integrated Al wire-bonding pad has two kind of thickness, 5000 angstroms under fuse-open and 10000 angstroms for the other area. This makes the fuse easy to blow without suffering any bondability from wire bonding for packaging.

While this invention has been described with reference to illustrative embodiments, this description is not intended or to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a fuse structure integrated a wire bonding on a low k interconnect substrate, said method comprising:

forming a cap layer on said low k interconnect substrate;

forming a metal layer on said cap layer;

removing a portion of said metal layer to form a concavity in said metal layer to define a fuse-open pattern;

removing a portion of said metal layer to define a pad pattern and a fuse pattern on said substrate, wherein said fuse pattern have said fuse-open pattern on the top of said fuse pattern;

forming a conformal passivation layer on said cap layer, said pad pattern, and said fuse pattern; and removing a portion of said conformal passivation layer to form a first opening in said pad pattern and a second opening in said fuse pattern, wherein said second opening is substantially over said concavity.

2. The method for forming said fuse structure integrated a wire bonding on a low k interconnect substrate according to claim 1, wherein said low k interconnect substrate comprises copper.

3. The method for forming said fuse structure integrated a wire bonding on a low k interconnect substrate according to claim 1, wherein said metal layer comprises aluminum.

4. The method for forming said fuse structure integrated a wire bonding on a low k interconnect substrate according to claim 1, wherein said step of removing is anisotropic etching.

5. The method for forming said fuse structure integrated a wire bonding on a low k interconnect substrate according to claim 4, wherein said anisotropic etching provides an opening in said second metal layer, and said opening keeping at a predetermined distance for said cap layer.

6. The method for forming said fuse structure integrated a wire bonding on a low k interconnect substrate according to claim 1, wherein said concavity is formed with a thickness of about 5000 angstroms in said metal layer.

7. The method for forming said fuse structure integrated a wire bonding on a low k interconnect substrate according to claim 1, wherein said passivation layer is selected from the group consisting of silicon nitride and silicon oxide.

8. The method for forming said fuse structure integrated a wire bonding on a low k interconnect substrate according to claim 2, wherein said conformal passivation layer is removed by using anisotropic etching.

9. A fuse structure integrated wire bonding on a substrate, said structure comprising:

a first metal layer as a metal pad on a first portion of said substrate;

a second metal layer as a fuse on a second portion of said substrate, wherein said second metal layer has a concavity therein and a thickness less than a thickness of said first metal layer; and a passivation layer on said first metal layer and said second metal layer, wherein said passivation layer has a first opening over said first metal layer and has a second opening substantially over said concavity of said second metal layer.

10. The fuse structure integrated wire bonding on a substrate according to claim 9, wherein said substrate comprises low k interconnect.

11. The fuse structure integrated wire bonding on a substrate according to claim 9, wherein said first metal layer comprises aluminum.

12. The fuse structure integrated wire bonding on a substrate according to claim 9, wherein said second metal layer comprises aluminum.

13. The fuse structure integrated wire bonding on a substrate according to claim 9, wherein thickness of said concavity is about 5000 angstroms in said second metal layer.

14. The fuse structure integrated wire bonding on a substrate according to claim 9, wherein said passivation layer is selected from the group consisting of silicon nitride and silicon oxide.

* * * * *